US007442318B2

(12) United States Patent
Yamamoto et al.

(10) Patent No.: US 7,442,318 B2
(45) Date of Patent: Oct. 28, 2008

(54) METHOD OF MAKING THERMAL PRINT HEAD

(75) Inventors: Masaya Yamamoto, Kyoto (JP); Shinobu Obata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 266 days.

(21) Appl. No.: 11/202,631

(22) Filed: Aug. 12, 2005

(65) Prior Publication Data

US 2006/0037189 A1 Feb. 23, 2006

(30) Foreign Application Priority Data

Aug. 18, 2004 (JP) ............................ 2004-237918

(51) Int. Cl.
*B41J 2/04* (2006.01)
*G01R 31/00* (2006.01)

(52) U.S. Cl. ............................ 216/27; 216/13; 216/17; 216/18; 216/59; 216/61; 29/610.1; 438/21

(58) Field of Classification Search .................. 216/13, 216/17, 18, 59, 61, 27; 29/610.1; 438/21
See application file for complete search history.

(56) References Cited

U.S. PATENT DOCUMENTS 5,679,268 A * 10/1997 Takahashi et al. ............. 216/18
5,767,006 A * 6/1998 Lee ............................ 438/597
6,566,887 B2 * 5/2003 Smith et al. ................. 324/514
6,585,904 B2 * 7/2003 Kukanskis et al. ............ 216/13
2003/0107311 A1 * 6/2003 Radigan et al. ............. 313/495

FOREIGN PATENT DOCUMENTS

JP 02-089654 * 3/1990
JP 2000-118024 * 4/2000

* cited by examiner

*Primary Examiner*—Shamim Ahmed
(74) *Attorney, Agent, or Firm*—Hamre, Schumann, Mueller & Larson, P.C.

(57) ABSTRACT

A method of manufacturing a thermal print head includes a conductor layer formation step, a first measurement step, a conductor layer splitting step and a second measurement step. In the conductor layer formation step, a single conductor layer including first and second measurement points is formed on a substrate. In the first measurement step, the electrical resistance is measured in the conductor layer, between the first and the second measurement points. In the conductor layer splitting step, a predetermined portion of the conductor layer is removed, so that a first electrode including the first measurement point and a second electrode including the second measurement point are formed. In the second measurement step, the resistance between the first and the second electrodes is measured. If the conductor layer has a disconnected portion in the first measurement step, a repairing conductor is formed on the disconnected portion.

12 Claims, 12 Drawing Sheets

METHOD OF MAKING THERMAL PRINT HEAD

BACKGROUND OF THE INVENTION

1. Field of the Invention

The present invention relates to a method of manufacturing a thermal print head.

2. Description of the Related Art

A method of manufacturing a thermal print head can be found in JP-A-2000-118024. According to this document, a glaze layer 92 is first formed on a substrate 91, as shown in FIG. 13 of the present application. This is followed by formation of an electrode 93 and a resistor 94 on the glaze layer 92. Finally a protection layer 95 constituted of glass is provided so as to cover the glaze layer 92, the electrode 93 and the resistor 94.

Upon formation of the protection layer 95, conductivity of the electrode 93 is inspected. When the electrode 93 is disconnected as pointed by numeral 93*a* in FIG. 13, the disconnected portion is repaired as follows.

As already stated, the glass protection layer 95 is formed after the formation of the electrode 93 (and the resistor 94). Therefore, the disconnected portion 93*a* is filled with a portion of the protection layer 95 as shown in FIG. 13. For repairing the disconnected portion, the portion of the protection layer present in the disconnected portion is heated. To be more detailed, the filled disconnected portion (i.e. the protection layer 95) contains an oxide of a conductive material. Heating the oxide for deoxidization turns the protection layer in the disconnected portion into a conductor, thereby restoring the conductivity of the disconnected portion of the electrode 93.

FIG. 14 shows another repairing method of the disconnection of the electrode 93. Once the electrode 93 proves to have the disconnected portion 93*a*, the portion of the protection layer 95 present in the disconnected portion 93*a* and in the proximity thereof is removed. Then the disconnected portion 93*a* is filled with a conductor 93*b*.

In either of the repairing methods, the disconnected portion 93*a* is repaired after the formation of the protection layer 95. This incurs a drop in production efficiency. Besides, the method according to FIG. 13 (heating of the protection layer 95) may fail to restore sufficient conductivity. Further, another type of defect may be caused at the electrode 93, including a short circuit of the electrode 93 with another conductor that is supposed to be insulated, for example. A measure has to be also taken against such undue conduction, in order to improve the yield of the product.

SUMMARY OF THE INVENTION

The present invention has been conceived in view of the foregoing situation. Accordingly, it is an object of the present invention to provide a method of manufacturing a thermal print head, which allows performing efficient processing against the emergence of malfunctions in the electrode including disconnection and short circuit. The term “processing” herein includes detection, repair work and so forth of the disconnection or short circuit in the electrode.

The present invention provides a method of manufacturing a thermal print head comprising: a conductor layer formation step for forming on a substrate a single conductor layer that includes a first measurement point and a second measurement point; a first measurement step for measuring electrical resistance between the first measurement point and the second measurement point in the conductor layer; a conductor layer splitting step for removing a predetermined portion of the conductor layer, to form a first electrode including the first measurement point and a second electrode including the second measurement point; and a second measurement step for measuring electrical resistance between the first electrode and the second electrode.

According to the above method of manufacturing, the first measurement step is performed prior to splitting the conductor layer into the first electrode and the second electrode, i.e. prior to the formation of the resistor. This facilitates detecting presence of a disconnected portion in the conductor layer. Besides, the second measurement step is also performed prior to the formation of the resistor. This allows effectively detecting undue conduction between the first electrode and the second electrode.

Preferably, the method of manufacturing according to the present invention may further comprise the step of forming, when a disconnected portion is detected in the conductor layer during the first measurement step, a repairing conductor on the disconnected portion, prior to the conductor layer splitting step.

Preferably, the conductor layer may be made of gold.

Preferably, the method of manufacturing according to the present invention may further comprise the step of forming a resistor that bridges over the first electrode and the second electrode, after the second measurement step.

Preferably, the method of manufacturing according to the present invention may further comprise an insulation step for electrically isolating the first electrode and the second electrode prior to the step of forming the resistor when the first electrode and the second electrode are found to be electrically connected in the second measurement step.

In the insulation step, the connecting portion via which the first electrode and the second electrode are connected to each other is removed.

Preferably, the method of manufacturing according to the present invention may further comprise the step of forming a glass layer covering at least a part of the second electrode, prior to the resistor formation step. The formation of the glass layer may be performed by a thick film printing method.

Preferably, the method of manufacturing according to the present invention may further comprise the step of forming a protection layer covering an entirety of the resistor and a part of the glass layer.

According to the present invention, the conductor layer formation step, the first measurement step, the conductor layer splitting step and the second measurement step may be respectively performed at least on each of a first substrate and a second substrate.

Preferably, the method of manufacturing according to the present invention may further comprise the steps of: forming a resistor that bridges over the first electrode and the second electrode on the respective substrates; and forming a glass layer covering at least a part of the second electrode on the respective substrates.

The respective substrates include an upper surface and a lower surface opposite to the upper surface. The conductor layer, the resistor and the glass layer may be formed on this upper surface.

Preferably, the method of manufacturing according to the present invention may further comprise the step of forming the protection layer covering the resistor on the respective substrates. The forming of the protection layer may be performed while the glass layer on the first substrate is held in contact with the lower surface of the second substrate. Further, in this contact state, the first substrate is disposed offset relative to the second substrate so that the resistor on the first substrate is not hidden by the second substrate. It should be noted here that the expression of "not hidden" means that the resistor is not located between the first substrate and the second substrate. Such arrangement facilitates forming the protection layer that covers the resistor, free from the interference by the second substrate.

The above and other features and advantages of the present invention will become more apparent through the following detailed description given with reference to the accompanying drawings.

DETAILED DESCRIPTION OF THE PREFERRED EMBODIMENT

Hereafter, a preferred embodiment of the present invention will be described in details, referring to the accompanying drawings.

Figure 1:
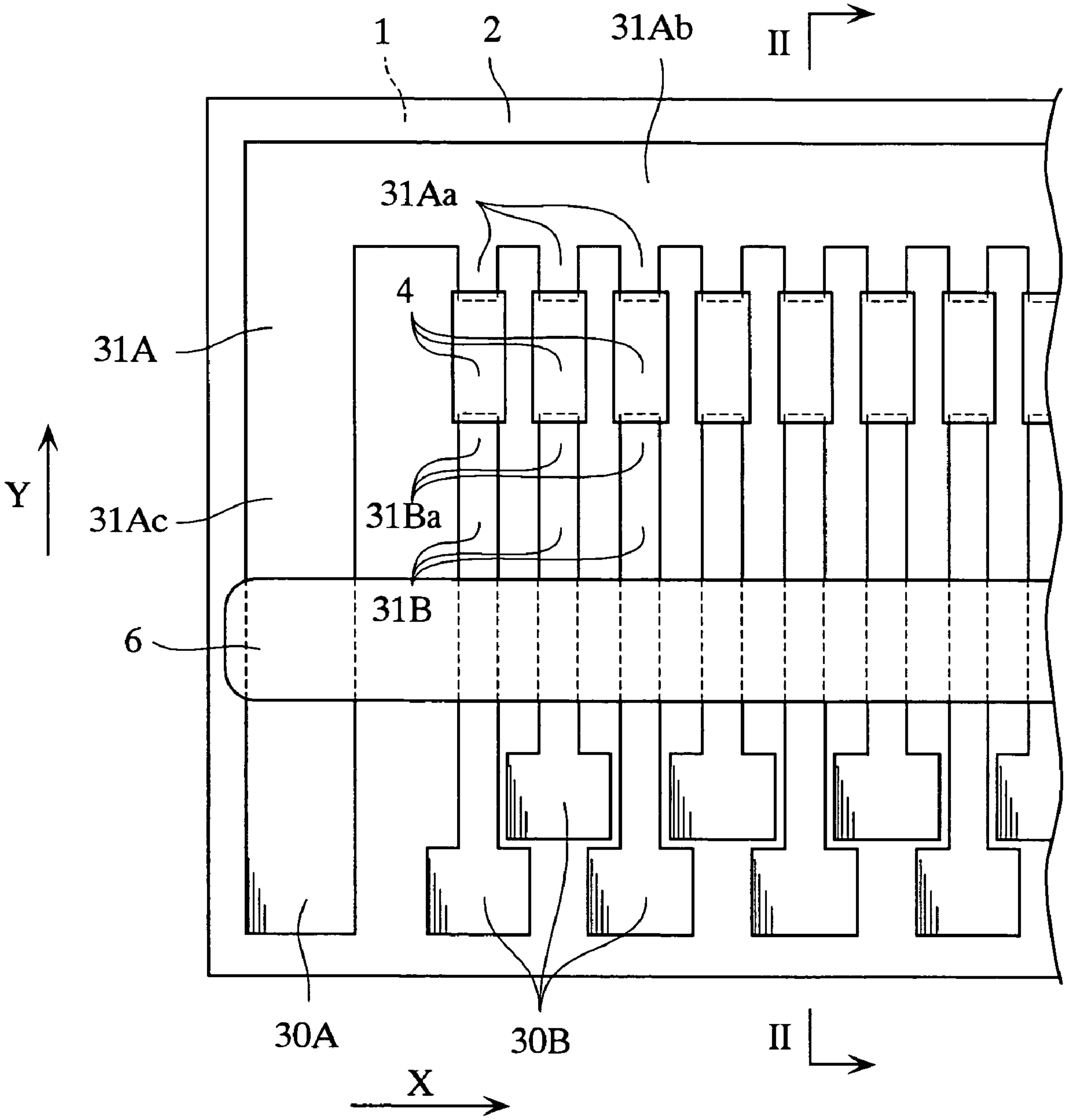
FIG. 1 is a fragmentary plan view showing a thermal print head fabricated by the method of manufacturing according to the present invention.
Figure 2:
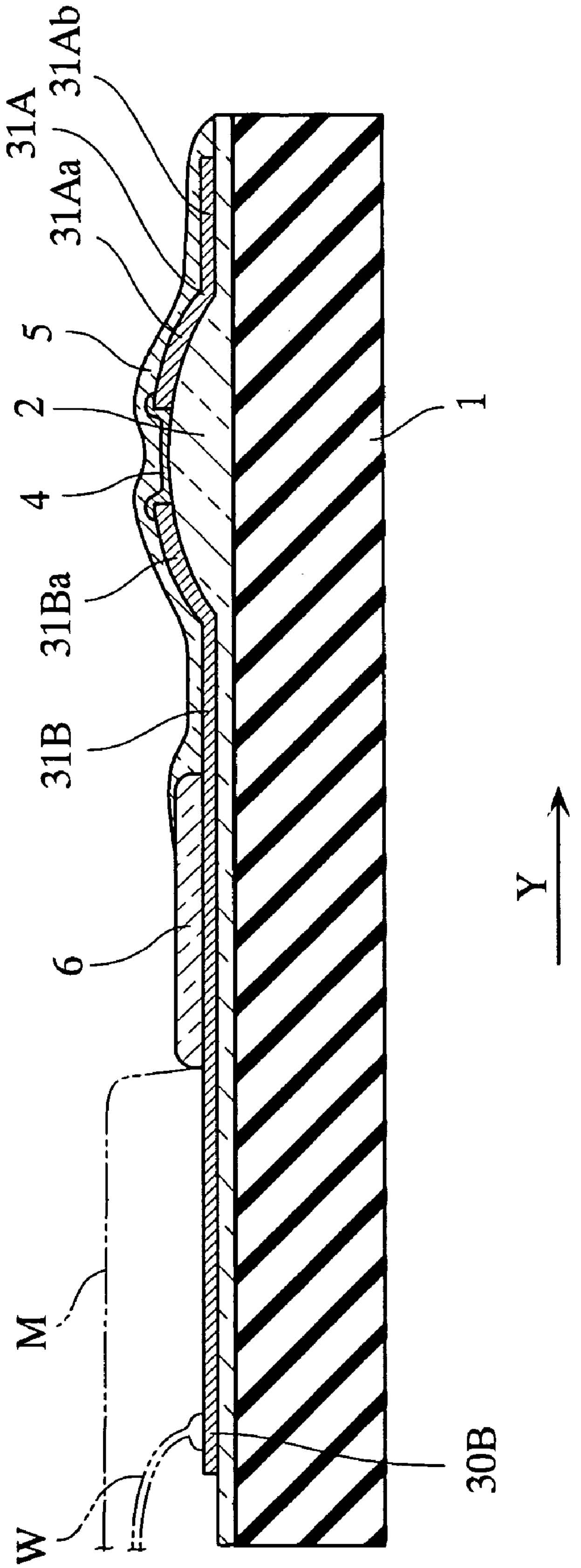
FIG. 2 is a cross-sectional view taken along the line II-II of FIG. 1.

FIGS. 1 and 2 illustrate an example of a thermal print head fabricated by the method of manufacturing according to the present invention. The thermal print head shown therein includes a substrate 1, a glaze layer 2, a common electrode 31A, a plurality of individual electrodes 31B, a plurality of resistors 4, a protection layer 5 (not shown in FIG. 1), and a glass spacer 6. The thermal print head serves to print a desired image on a thermal paper (not shown) which relatively moves in a secondary scanning direction Y. To be more detailed, a driver IC (not shown) selectively supplies a current to the resistor 4 via an individual electrode 31B, according to printing data. This causes the selected resistor 4 to heat up, so that a dot is printed on the thermal paper.

The substrate 1 is an insulating plate of a rectangular shape in a plan view, constituted of an alumina ceramic for example. On the substrate 1, the glaze layer 2 is provided. The glaze layer 2 includes a ridge portion extending longitudinally of the substrate 1 (main scanning direction X). The glaze layer 2 may be formed through applying a glass paste to the substrate 1 by a thick film printing method, and baking the applied paste. During the baking process, the glass component in the paste flows. Accordingly, the upper surface of the ridge portion presents a smooth arcuate shape in a cross-sectional view (Ref. FIG. 2).

On the glaze layer 2, the common electrode 31A and the plurality of individual electrodes 31B are provided. The common electrode 31A and the individual electrodes 31B are both made of gold (hereinafter, Au). The electrodes 31A and 31B may be formed through the following steps. Au resinate is first applied to the glaze layer 2 by a thick film printing method. Then the Au resinate applied is baked so as to form an Au layer in a predetermined thickness. On the upper surface of the Au layer, a resist layer is formed in a predetermined pattern delineated by photolithography. Finally an etching process is performed on the Au layer utilizing the resist layer as a mask, thus to form the electrodes 31A and 31B.

As shown in FIG. 1, the common electrode 31A includes a first strip portion 31Ab, a second strip portion 31Ac, and a plurality of extensions 31Aa. The first strip portion 31Ab extends in the main scanning direction X, along a region close to a longitudinal side (the upper longitudinal side in FIG. 1) of the substrate 1. The second strip portion 31Ac extends in the secondary scanning direction Y from an end portion (the left end portion in FIG. 1) of the first strip portion 31Ab. The plurality of extensions 31Aa respectively projects from the first strip portion 31Ab in the secondary scanning direction Y, on the right hand side of the second strip portion 31Ac (that is, closer to the central portion of the first strip portion 31Ab). The extensions 31Aa are aligned in the main scanning direction X, at regular intervals among one another.

The strip portion 31Ac includes a first end portion 30A. The individual electrodes 31B respectively include a strip portion 31Ba and a second end portion 30B. The strip portion 31Ba extends in the secondary scanning direction Y, and has a certain width (a size measured in the main scanning direction X). The second end portion 30B is wider than the strip portion 31Ba. The upper end of each strip portion 31Ba is disposed so as to oppose a corresponding one of the extensions 31Aa in the secondary scanning direction Y, with a predetermined spacing therebetween.

The first end portion 30A and the second end portion 30B are electrically connected to the driver IC (not shown) via a bonding wire W (FIG. 2). For protecting the bonding wire W (and other elements), a resin sealing material M is provided on the substrate 1.

The plurality of resistor 4 is respectively disposed so as to bridge over the extension 31Aa and the individual electrodes 31B, more specifically the strip portion 31Ba thereof. As shown in FIG. 1, the resistors 4 are aligned in a row in the main scanning direction X, with spacing among one another. The resistor 4 may be constituted of a thin film of $TaSiO_2$, formed by CVD or sputtering.

The protection layer 5 is provided so as to cover the resistors 4, the common electrode 31A and the individual electrodes 31B. The protection layer 5 may be constituted of $Si_3N_4$, formed by CVD or sputtering.

The glass spacer 6 is disposed so as to intersect and cover the strip portions 31Ba of the individual electrodes 31B. The spacer 6 is formed by thick film printing of the glass paste and baking the glass paste. The spacer 6 is utilized to properly overlay a plurality of substrates 1 when forming the protection layer 5, as will be described below.

Now referring to FIGS. 3 through 12, the method of manufacturing the thermal print head according to the present invention will be described hereunder.

Figure 3:
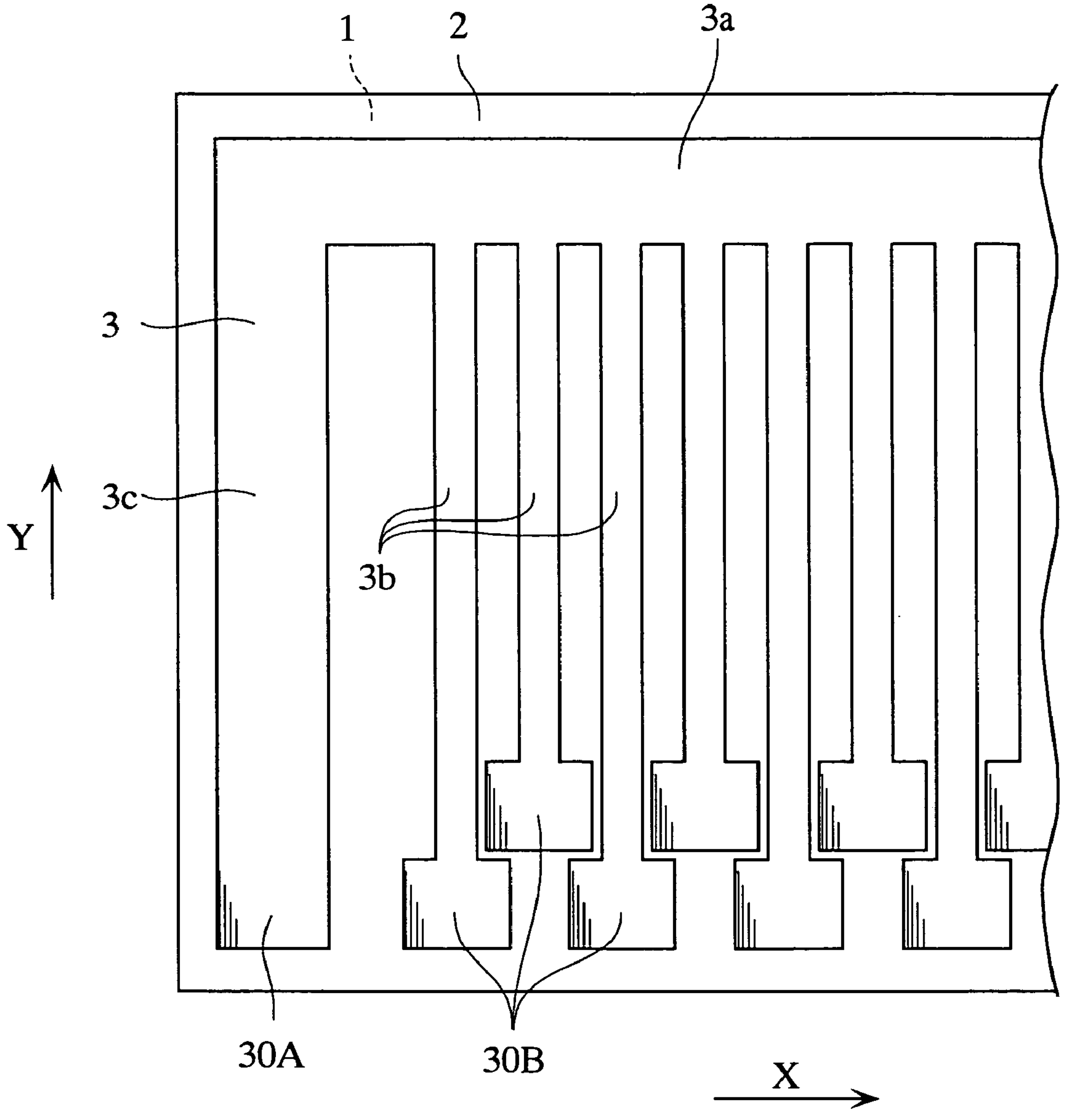
FIG. 3 is a fragmentary plan view for explaining a manufacturing process of the thermal print head according to the present invention.

Referring first to FIG. 3, the substrate 1 is provided, on the upper surface of which the glaze layer 2 and the conductor layer 3 are formed. To form the conductor layer 3, the Au resinate is applied all over the upper surface of the substrate 1 by thick film printing. Then the Au resinate thus applied is baked together with the substrate 1, so that a thick film of Au is formed. The Au thick film is subjected to an etching process (with a mask photolithographically prepared), to form the conductor layer 3 in a predetermined pattern. The patterning in this process includes forming the strip portion 3*a* (extending in the main scanning direction X), the extensions 3*b* (extending in the secondary scanning direction Y from the strip portion 3*a*), and the strip portion 3*c* (extending in the secondary scanning direction Y from an end portion of the strip portion 3*a*). The end portion of the strip portion 3*c* corresponds to the first end portion 30A, and the end portions of the extensions 3*b* correspond to the second end portions 30B.

After the formation of the conductor layer 3, the electrical resistance between the first end portion 30A and each of the second end portions 30B is measured. In this step (the first resistance measurement step), an electrical resistance meter (not shown) with a pair of probes is employed. Specifically, one of the pair of probes is made to contact the first end portion (the first measurement point) 30A, and the other probe is made to contact the second end portion (the second measurement point) 30B. With the probes thus arranged, the electrical resistance between the probes is measured. At the stage of performing the first resistance measurement step, the first end portion 30A and the second end portions 30B are included in the conductor layer 3. Accordingly, provided that the conductor layer 3 has been properly formed, the resistance measured should be significantly lower (substantially zero) than, for example, the electrical resistance of the resistor 4 shown in FIG. 1. Here, although the first measurement point corresponds to the end portion of the strip portion 3*c* and the second measurement point corresponds to the end portion of each extension 3*b* in this embodiment, the present invention is not limited to such measurement method. The first measurement point or the second measurement point may be set at a different point of a predetermined conductive element as need be, without limitation to the end portion of the conductive element.

Figure 4:
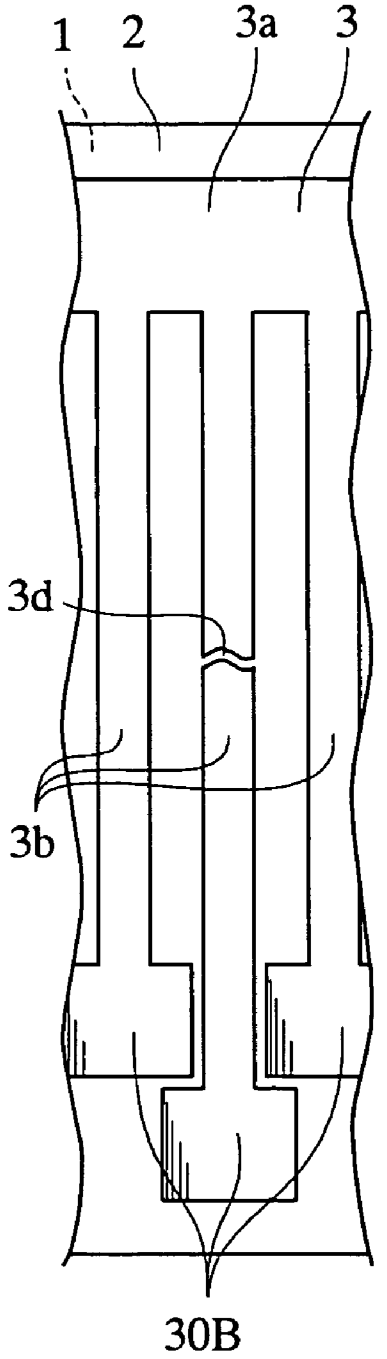
FIG. 4 is a fragmentary plan view showing a disconnection in a conductor layer.
Figure 5:
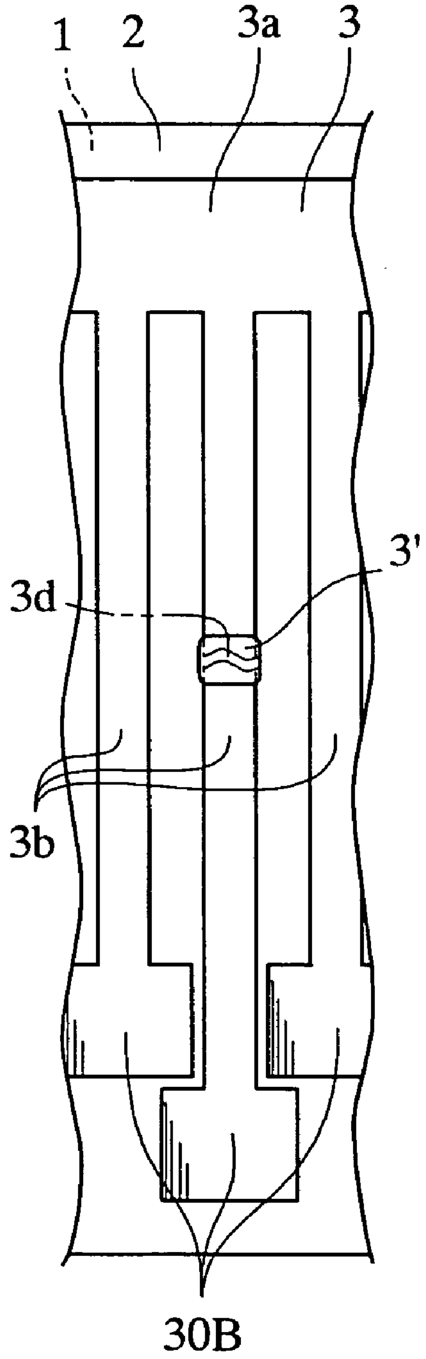
FIG. 5 is a fragmentary plan view for explaining a repair method of the disconnection.

If the electrical resistance between the first end portion 30A and any of the second end portion 30B is much higher than zero (higher than a predetermined reference value), it is probable that a disconnected portion 3*d* is present in the conductor layer 3 between the first end portion 30A and the second end portion 30B in question, as the example shown in FIG. 4. In this case, the location of the disconnected portion 3*d* is first identified, after which the Au resinate is applied so as to cover the disconnected portion 3*d* as shown in FIG. 5, and the Au resinate is baked thus to form a repairing conductor 3'. The conductor 3' serves to repair the disconnected portion 3*d*, to thereby restore the proper conductivity of the conductor layer 3. The formation of the conductor 3' is performed each time an additional disconnected portion is detected. The state that the measured resistance is higher than the predetermined reference value will be herein defined as "the resistance value is substantially infinite".

Figure 6:
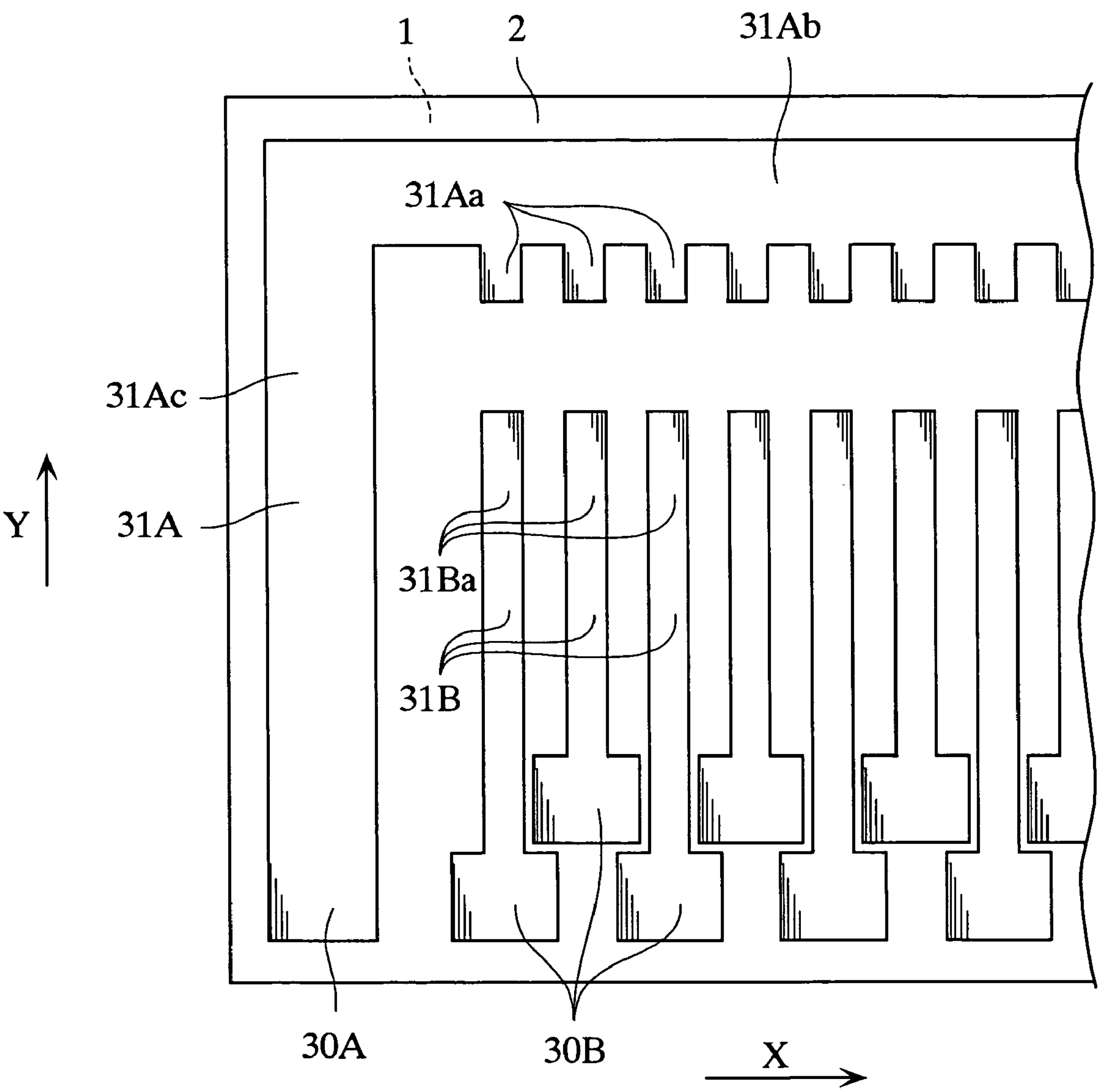
FIG. 6 is a fragmentary plan view showing the conductor layer split into a common electrode and individual electrodes.

Referring then to FIG. 6, the conductor layer 3 is split into the common electrode 31A and a plurality of individual electrodes 31B. To be more detailed, an etching process is performed in combination with photolithography so as to remove a portion of the respective strip portions 3*b* of the conductor layer 3 shown in FIG. 3. As a result, the conductor layer 3 is split into the common electrode 31A that includes the first end portion 30A, and the individual electrodes 31B that respectively include the second end portion 30B, as shown in FIG. 6.

After the formation of the common electrode 31A and the individual electrodes 31B, the electrical resistance between the common electrode 31A and each of the individual electrodes 31B is measured (the second resistance measurement step). In this step, a similar electrical resistance meter to that used in the first measurement step is employed. Specifically, a first probe is made to contact the first end portion 30A of the common electrode 31A, and the second probe is made to contact the second end portion 30B of the respective individual electrodes 31B, so that the electrical resistance between the probes is measured. At the stage of performing the second resistance measurement step, the common electrode 31A and the individual electrodes 31B are supposed to be separated. Accordingly, the resistance value obtained in the second resistance measurement step should normally be substantially infinite.

Figure 7:
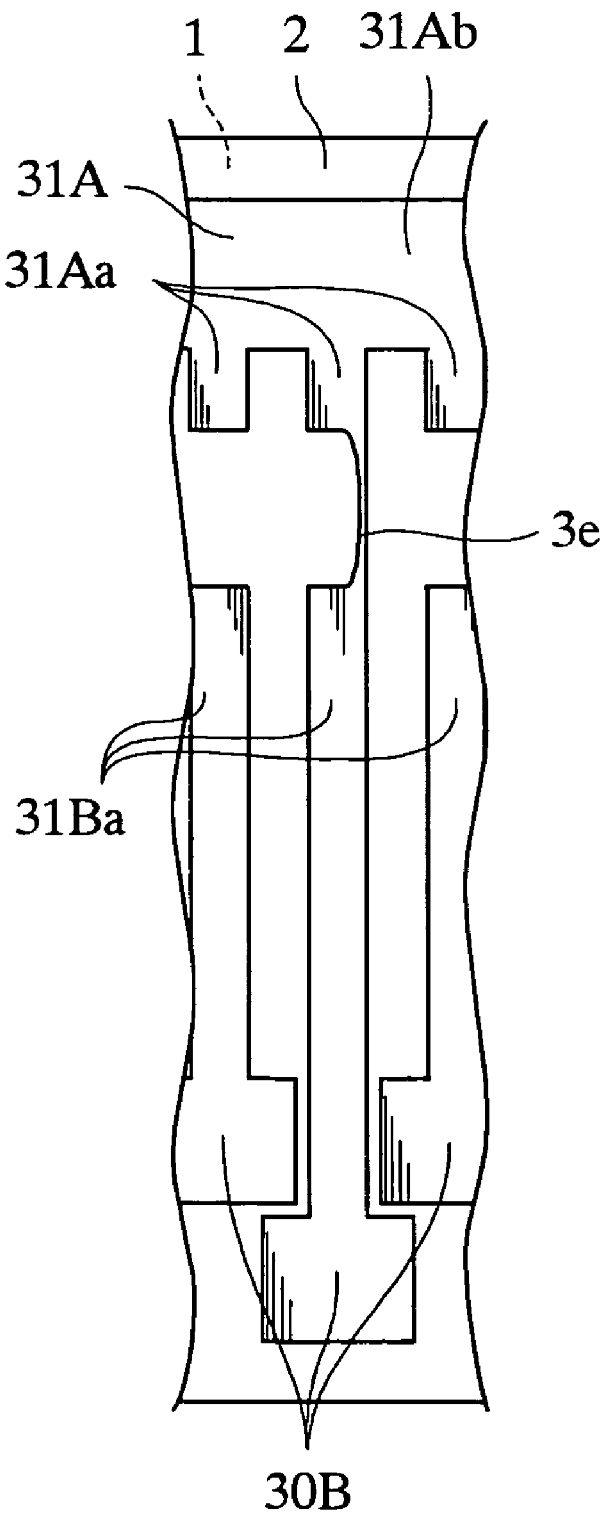
FIG. 7 is a fragmentary plan view showing a bridge in the conductor layer.

If the electrical resistance between the common electrode 31A and any of the individual electrodes 31B is not substantially infinite, it is probable that a bridge 3*e* is present between the common electrode 31A and the individual electrode 31B in question, as shown in FIG. 7. In this case, the location of the bridge 3*e* is first identified, after which the bridge 3*e* is mechanically cut away. As a result, the common electrode 31A and the individual electrode 31B in question are properly insulated. Such removal is performed each time an undue conduction is detected.

Figure 8:
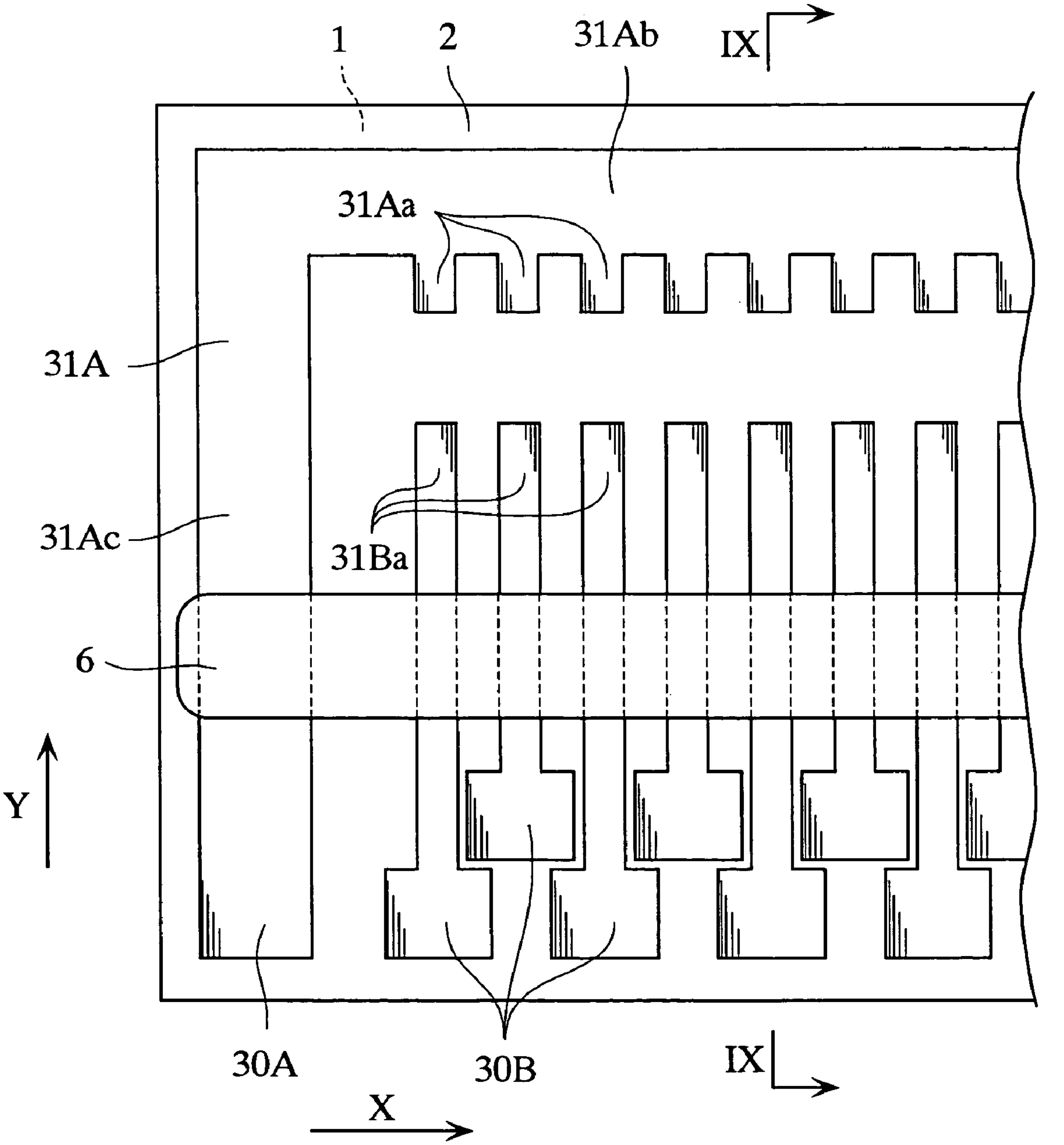
FIG. 8 is a fragmentary plan view for explaining a manufacturing process of a glass spacer.
Figure 9:
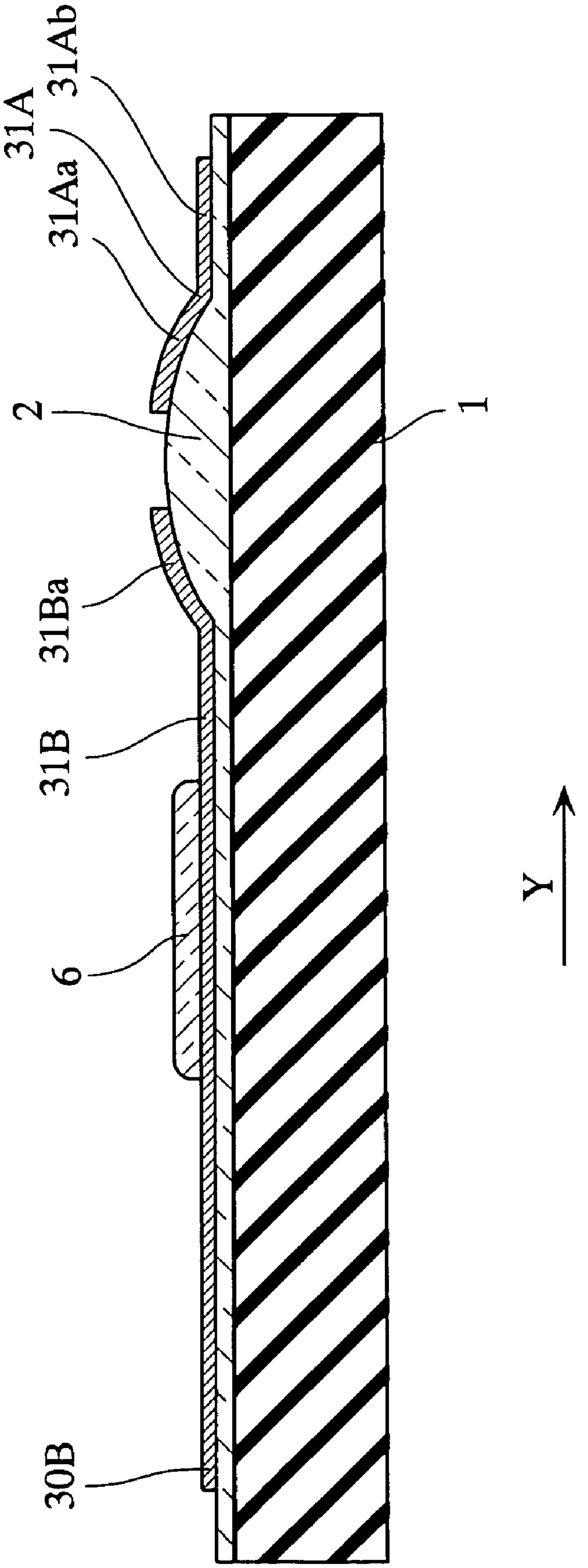
FIG. 9 is a cross-sectional view taken along the line IX-IX of FIG. 8.

After the split off of the common electrode 31A and the plurality of individual electrodes 31B, the glass spacer 6 is formed as shown in FIG. 8. Specifically, a thick film of the glass paste is formed by thick film printing, so as to intersect the individual electrodes 31B. The glass paste thick film is baked together with the substrate 1, to thereby form the spacer 6. As is apparent from FIG. 9, the spacer 6 thus formed is thicker than the common electrode 31A and the individual electrodes 31B.

Figure 10:
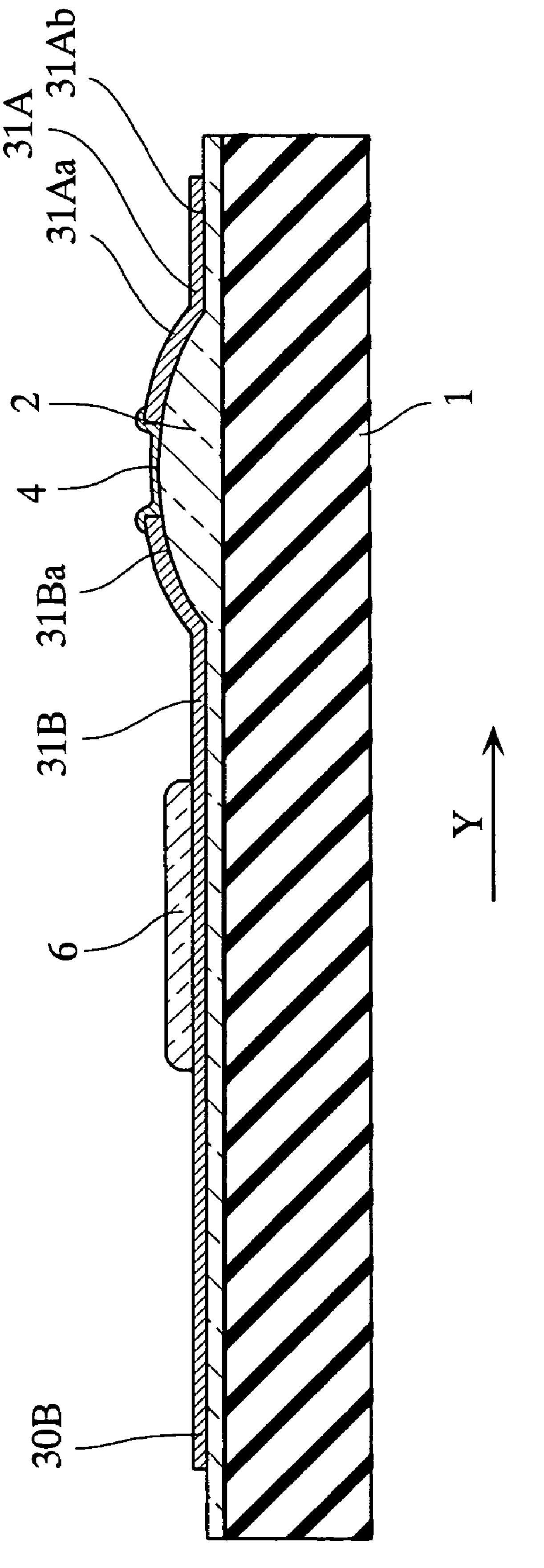
FIG. 10 is a cross-sectional view for explaining a manufacturing process of a resistor between the common electrode and the individual electrodes.

The formation of the spacer 6 is followed by formation of the plurality of resistors 4 as shown in FIG. 10. The resistors 4 may be constituted of $TaSiO_2$, formed by CVD or sputtering. The resistors 4 respectively bridge between each extension 31Aa of the common electrode 31A and the strip portion 31Ba of the opposing individual electrode 31B.

Figure 11:
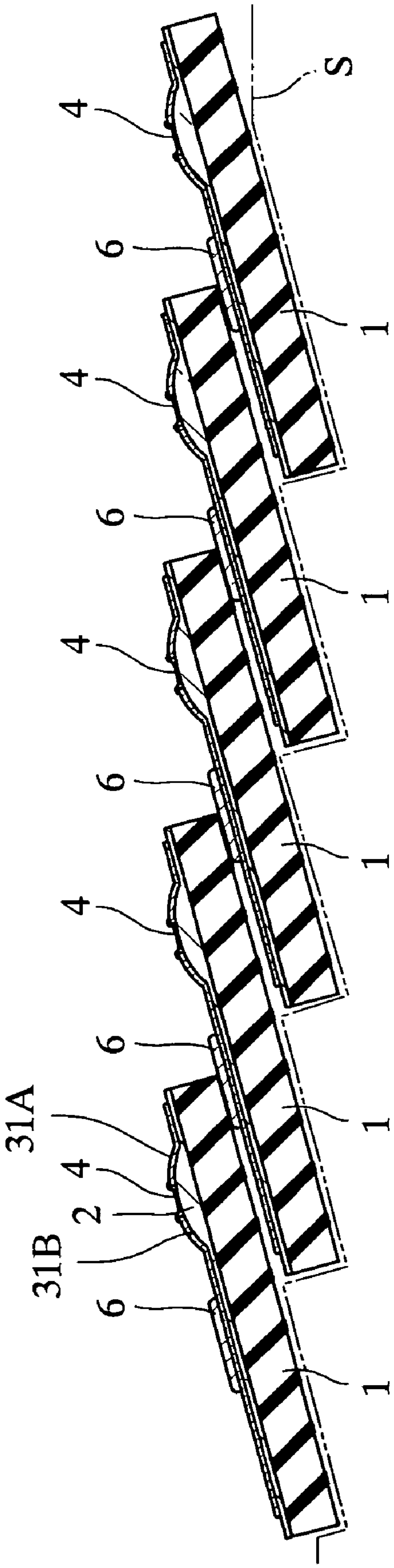
FIG. 11 is a cross-sectional view for explaining a manufacturing process of the thermal print head according to the present invention, wherein a plurality of substrates is placed on a processing table so as to partially overlap one another.

After the formation of the resistors 4, the protection layer 5 is formed on the substrate 1. To be more detailed, as shown in FIG. 11, a plurality of substrates 1 is first placed on a stair-shaped processing table S (indicated by the double-dashed chain line), such that the substrates 1 partially overlap one another. Under such state, two substrates 1 adjacent to each other are separated via the spacer 6. In further details, the spacer 6 provided on the lower-level substrate 1 of the two adjacent substrates is in contact with the lower surface of the upper-level substrate 1. The two adjacent substrates 1 are thus separated from each other with a predetermined spacing therebetween. Also, the two substrates 1 are relatively shifted along an extension of the short side of each substrate (in the direction Y in FIG. 1). Therefore, the resistor 4 formed on the lower-level substrate 1 is exposed, without being covered with the upper-level substrate 1.

Figure 12:
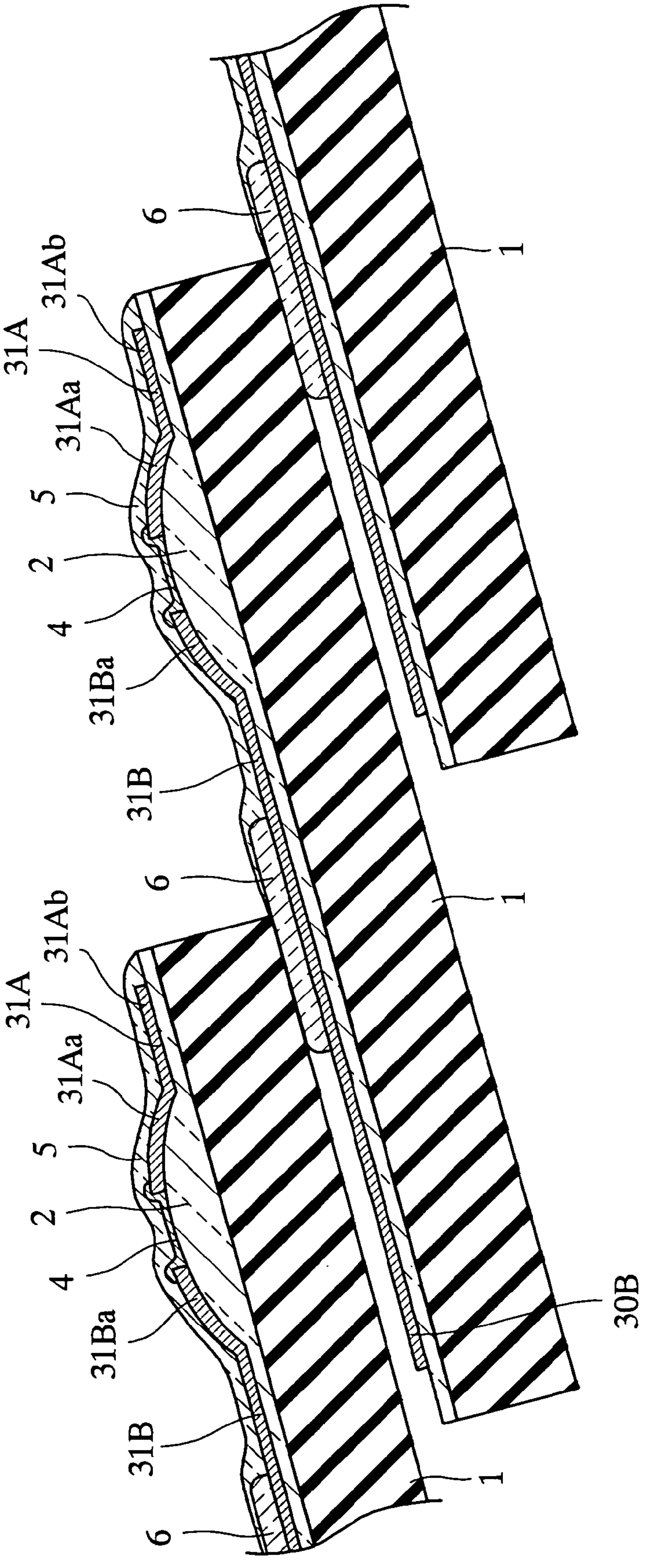
FIG. 12 is a cross-sectional view for explaining a process of integrally forming a protection layer for the plurality of substrates.
Figure 13:
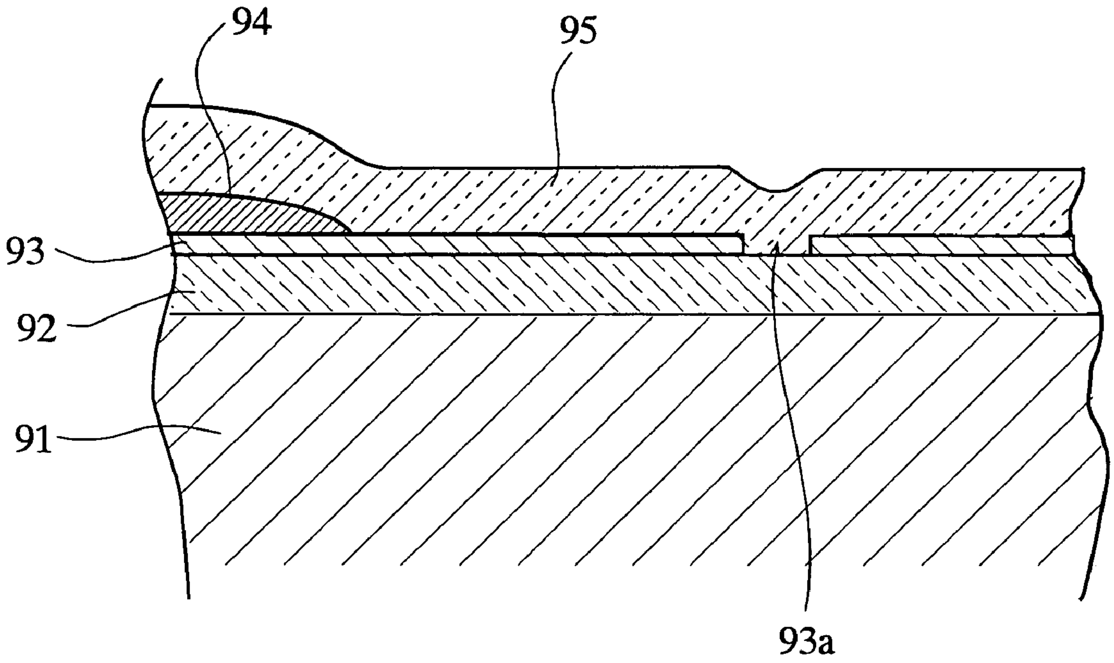
FIG.13 PRIOR ART
FIG. 13 is a cross-sectional view for explaining a manufacturing process of a thermal print head according to a conventional technique.
Figure 14:
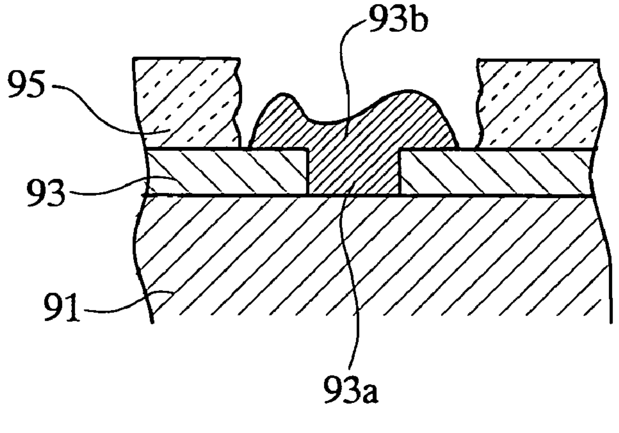
FIG.14 PRIOR ART
FIG. 14 is a cross-sectional view for explaining a conventional repair method of a disconnection.

Proceeding now to FIG. 12, the protection layer 5 is formed on the respective substrates 1 at a time. The protection layer 5 may be constituted of $Si_3N_4$, formed by CVD or sputtering. The protection layer 5 covers the resistors 4, the extensions 31Aa and strip portion 31Ab of the common electrode, the end portion of the strip portion 31Ba of the respective individual electrodes and so forth. The protection layer 5 also covers a part of the spacer 6.

Referring back to FIG. 2, the first end portion 30A of the common electrode 31A and the second end portion 30B of the individual electrodes 31B are connected to the driver IC (not shown) via the wire W. The wire connection enables the driver IC to apply current to the resistors 4 via the respective individual electrodes 31B. After providing the wire W for the connection, the sealing material M is applied so as to cover the wire W, the first and the second end portions 30A, 30B. To form the sealing material M, a resin molding method may be employed.

Through the above-described processes, the thermal print head shown in FIGS. 1 and 2 is manufactured.

According to the method of manufacturing thus arranged, the first resistance measurement step is performed prior to splitting the conductor layer 3 (Ref. FIG. 3) into the common electrode and the individual electrodes. If the resistance measured in this step is substantially zero, the conductor layer 3 can be considered to have been properly formed. On the other hand, if the measured resistance is "substantially infinite", it is probable that a defect such as a disconnected portion 3*d* shown in FIG. 4 is present in the conductor layer 3. Thus, according to the foregoing method, the distinction ("zero-infinite distinction") of the measured resistance between two clearly different values ("substantially zero" and "substantially infinite") leads to detection of a defect in the conductor layer 3, which can be easily executed. The repair work of a disconnected portion 3*d* can be easily performed, by baking the applied Au resinate to thereby form the repairing conductor 3' (FIG. 5).

In contrast, in the case of performing the first resistance measurement step after splitting the conductor layer 3 into the common electrode 31A and the individual electrodes 31B and further forming the resistors 4, it is relatively difficult to detect a detective portion in the conductor layer 3. In such a case, accordingly, it is necessary to determine whether the measured resistance is similar to the electrical resistance of the resistors 4 or substantially infinite (non-zero-infinity distinction). It is evident to those skilled in the art that this distinction between non-zero and infinity is more difficult to execute than the zero-infinite distinction described above.

Further, in the method of manufacturing according to the present invention, the repair work of a disconnected portion 3*d* is performed prior to the formation of the resistors 4 (FIG. 5). Such arrangement eliminates the likelihood of undue oxidation of the resistor 4 because of the repair work. Also, at the stage of forming the repairing conductor 3', the protection layer 5 has not yet been formed. Therefore, the repair work can be easily and efficiently performed, free from the interference by the protection layer 5. Still another advantage is that, since the conductor layer 3 is constituted of Au, the conductor layer 3 is scarcely oxidized during the formation of the conductor 3'. According to the present invention, naturally, the conductor layer 3 may be constituted of another material than Au. In this case, it is preferable that such another material is selected from conductive materials having similar heat resistance and oxidation resistance to those of Au, so as to prevent undue oxidation of the conductor layer 3.

In the method of manufacturing according to the present invention, the second resistance measurement step is performed under a state that the common electrode 31A and the individual electrodes 31B have been formed but the resistors 4 have not yet been formed, as shown in FIG. 6. Accordingly, the distinction between zero and infinity can also be applied to the electrical resistance measured in the second resistance measurement step, for detection of a defect such as the bridge 3*e* shown in FIG. 7. Specifically, if the resistance between the common electrode 31A and one of the individual electrodes 31B is substantially infinite, it can be considered that the bridge 3*e* is not present. In contrast, if the measured resistance is substantially zero, the bridge 3*e* is considered to be present. In the case where the second resistance measurement step is performed after the formation of the resistors 4 (FIG. 1), unlike the method of manufacturing according to the present invention, it is difficult to distinguish whether the measured resistance value represents the resistance of the resistor 4 alone, or the resistance including the bridge 3*e*.

If the bridge 3*e* is detected during the method of manufacturing according to the present invention, the bridge 3*e* can be removed by an appropriate method, such as a mechanical or chemical processing. At this stage the protection layer 5 is not present yet. Therefore, the bridge 3*e* can be easily removed, free from the interference by the protection layer 5.

As described referring to FIG. 12, the protection layer 5 can be formed at a time on a plurality of substrates 1 partially overlapping one another. In this process, the substrates 1 adjacent to each other are separated by the spacer 6. Such arrangement eliminates the likelihood that the common electrode 31A or the individual electrodes 31B formed on the lower-level substrate 1 are damaged by the lower surface of the upper-level substrate 1. In the arrangement shown in FIG. 12 especially, the spacer 6 extends in the main scanning direction X (Ref. FIG. 1), thus covering all of the plurality of individual electrodes 31B. Such structure can effectively protect the individual electrodes 31B. Also, the spacer 6 is formed (i.e. the applied glass paste is baked) prior to the formation of the resistors 4. Therefore, there is no likelihood that the resistors 4 are unduly oxidized during the formation of the spacer 6.

Although the present invention has been described based on the foregoing embodiment, it is to be understood that various modifications may be made without departing from the spirit and scope of the present invention, and that all such modifications that are apparent to those skilled in the art are included in the appended claims.

The invention claimed is:

1. A method of manufacturing a thermal print head that comprises a substrate, a common electrode having a plurality of extensions, a plurality of individual electrodes each paired with a respective one of the extensions of the common electrode, and a plurality of resistors each bridging between the respective extension of the common electrode and the paired individual electrode, the method comprising:

forming on the substrate a patterned conductor layer including the common electrode and the individual electrodes, each of the extensions included in the common electrode being initially connected to a respective one of the individual electrodes;

removing a predetermined part of the conductor layer to provide a split portion for separating each of the extensions from the respective individual electrode; and forming a resistor at the split portion of the conductor layer for bridging between each of the extensions and the respective individual electrode;

wherein a first measurement step is performed to measure an electrical resistance between a first measurement point corresponding to the common electrode and a second measurement point corresponding to each of the individual electrodes before removal of the predetermined part of the conductor layer; and wherein a second measurement step is performed to measure an electrical resistance between the first measurement point and the second measurement point after the removal of the predetermined part of the conductor layer but before the formation of the resistor.

2. The method of manufacturing a thermal print head according to claim 1, further comprising a step of forming, when a disconnected portion is detected in the conductor layer during the first measurement step, a repairing conductor on the disconnected portion, prior to the removal of the predetermined portion of the conductor layer.

3. The method of manufacturing a thermal print head according to claim 1, wherein the conductor layer is made of gold.

4. The method of manufacturing a thermal print head according to claim 1, further comprising an insulation step for electrically isolating a selected one of the extensions and a corresponding one of the individual electrodes prior to the step of forming the resistor when the selected extension and the corresponding individual electrode are detected to be electrically connected in the second measurement step.

5. The method of manufacturing a thermal print head according to claim 4, wherein the insulation step includes removing a connecting portion via which the selected extension and the corresponding individual electrode are mutually connected.

6. The method of manufacturing a thermal print head according to claim 1, further comprising the step of forming a glass layer covering at least a part of each of the individual electrodes, prior to the formation of the resistor.

7. The method of manufacturing a terminal print head according to claim 6, wherein the glass layer is made by using a thick film printing process.

8. The method of manufacturing a thermal print head according to claim 6, further comprising the step of forming a protection layer covering an entirety of the resistor and a part of the glass layer.

9. The method of manufacturing a thermal print head according to claim 1, wherein the formation of the conductor layer, the first measurement step, the partial removal of the conductor layer, the second measurement step and the formation of the resistor are respectively performed at least on each of a first substrate and a second substrate.

10. The method of manufacturing a thermal print head according to claim 9, further comprising a steps of forming a glass layer covering at least a part of each of the individual electrodes on the respective substrates.

11. The method of manufacturing a thermal print head according to claim 10, wherein each of the substrates includes an upper surface and a lower surface opposite to the upper surface, and wherein the conductor layer, the resistor and the glass layer are formed on the upper surface.

12. The method of manufacturing a thermal print head according to claim 11, further comprising a step of forming a protection layer covering the resistor, wherein the forming of the protection layer is performed when the glass layer on the first substrate touches the lower surface of the second substrate in a manner such that the first substrate is disposed offset relative to the second substrate to prevent the resistor on the first substrate from being hidden by the second substrate.

* * * * *